US008120519B2

(12) United States Patent
Bales

(10) Patent No.: US 8,120,519 B2
(45) Date of Patent: Feb. 21, 2012

(54) SHARED OPERATIONAL TRANSCONDUCTANCE AMPLIFIER PIPELINED ADC INCORPORATING A SAMPLE/HOLD AMPLIFIER AND MULTIPLE MDAC STAGES

(75) Inventor: James Edward Bales, Fort Collins, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 74 days.

(21) Appl. No.: 12/793,985

(22) Filed: Jun. 4, 2010

(65) Prior Publication Data

US 2011/0298645 A1  Dec. 8, 2011

(51) Int. Cl.
*H03M 1/38* (2006.01)
(52) U.S. Cl. .................. 341/161; 341/155; 341/172
(58) Field of Classification Search ........... 341/155–172
See application file for complete search history.

(56) References Cited

U.S. PATENT DOCUMENTS

| 5,534,864 | A * | 7/1996 | Ono et al. ............... 341/156 |
| 6,396,429 | B2 * | 5/2002 | Singer et al. ............. 341/155 |
| 7,164,379 | B1 * | 1/2007 | Rao ........................ 341/161 |
| 7,551,115 | B2 * | 6/2009 | Bailey et al. ............. 341/161 |
| 7,564,389 | B1 * | 7/2009 | Byrd et al. ............... 341/143 |
| 2009/0128391 | A1 * | 5/2009 | Bailey et al. ............. 341/172 |

OTHER PUBLICATIONS

"Application Note 1023, Understanding Pipelined ADCs", *Maxim Integrated Products, Inc.*, (Mar. 1, 2001).
Lee, Byung-Geun, et al., "A 14-b 100-MS/s Pipelined ADC With a Merged SHA and First MDAC", *IEEE Journal of Solid-State Circuits*, vol. 43, No. 12, (Dec. 2008).
Mehr, Iuri, et al., "A 55-mW, 10-bit, 40-Msample/s Nyquist-Rate CMOS ADC", *IEEE Journal of Solid-State Circuits*, vol. 35, No. 3, (Mar. 2000).

* cited by examiner

*Primary Examiner* — Lam T Mai
(74) *Attorney, Agent, or Firm* — Blakely Sokoloff Taylor & Zafman LLP

(57) ABSTRACT

A single operational transconductance pipelined ADC incorporating a sample/hold amplifier and multiple MDAC stages. An input signal is sampled on input signal sampling capacitors, and then coupled around an operational transconductance amplifier (OTA) so that the output of the OTA is equal to the sampled voltage. There is no net charge transfer in this operation, so the noise and power dissipation normally associated with an input sample and hold circuitry (SHA) in a pipelined ADC is substantially eliminated. A pipelined ADC using a shared OTA for sample/hold and two MDACs is disclosed.

15 Claims, 12 Drawing Sheets

SHARED OPERATIONAL TRANSCONDUCTANCE AMPLIFIER PIPELINED ADC INCORPORATING A SAMPLE/HOLD AMPLIFIER AND MULTIPLE MDAC STAGES

BACKGROUND OF THE INVENTION

1. Field of the Invention

The present invention relates to the field of pipelined ADCs (analog to digital converters).

2. Prior Art

Pipelined ADCs and flash ADCs are well known in the prior art. Good reviews of the principles thereof can be found in Maxim Integrated Products'. Application Note 1023 "Understanding Pipelined ADCs", and in Maxim Integrated Products' Application Note 810 "Understanding Flash ADCs", respectively. A pipelined ADC typically has a sample and hold circuit on the analog signal input, which dissipates power and injects noise into the ADC. This problem is addressed in prior art by completely eliminating the sample and hold and sampling directly onto the first MDAC (multiplying digital to analog converter) capacitors. In this prior art implementation, an independent sampler in parallel with the MDAC is required for the comparators.

Also known are ADCs that use a shared operational transconductance amplifier (OTA). In such implementations, a single OTA is shared during different phases by multiple multiplying digital to analog converters.

DETAILED DESCRIPTION OF THE PREFERRED EMBODIMENTS

This invention solves the problem of additional noise and power dissipation associated with an input sample and hold circuitry (SHA) in a pipelined ADC. A 4-phase shared OTA stage that implements a SHA (sample and hold), MDAC1, and MDAC2 is described herein. Although there is a speed penalty associated with the additional clock phases, this is largely mitigated by the minimal settling time required for the SHA. Also, the noise penalty of a SHA is eliminated because a charge conserving flip-around architecture is employed.

Figure 1:
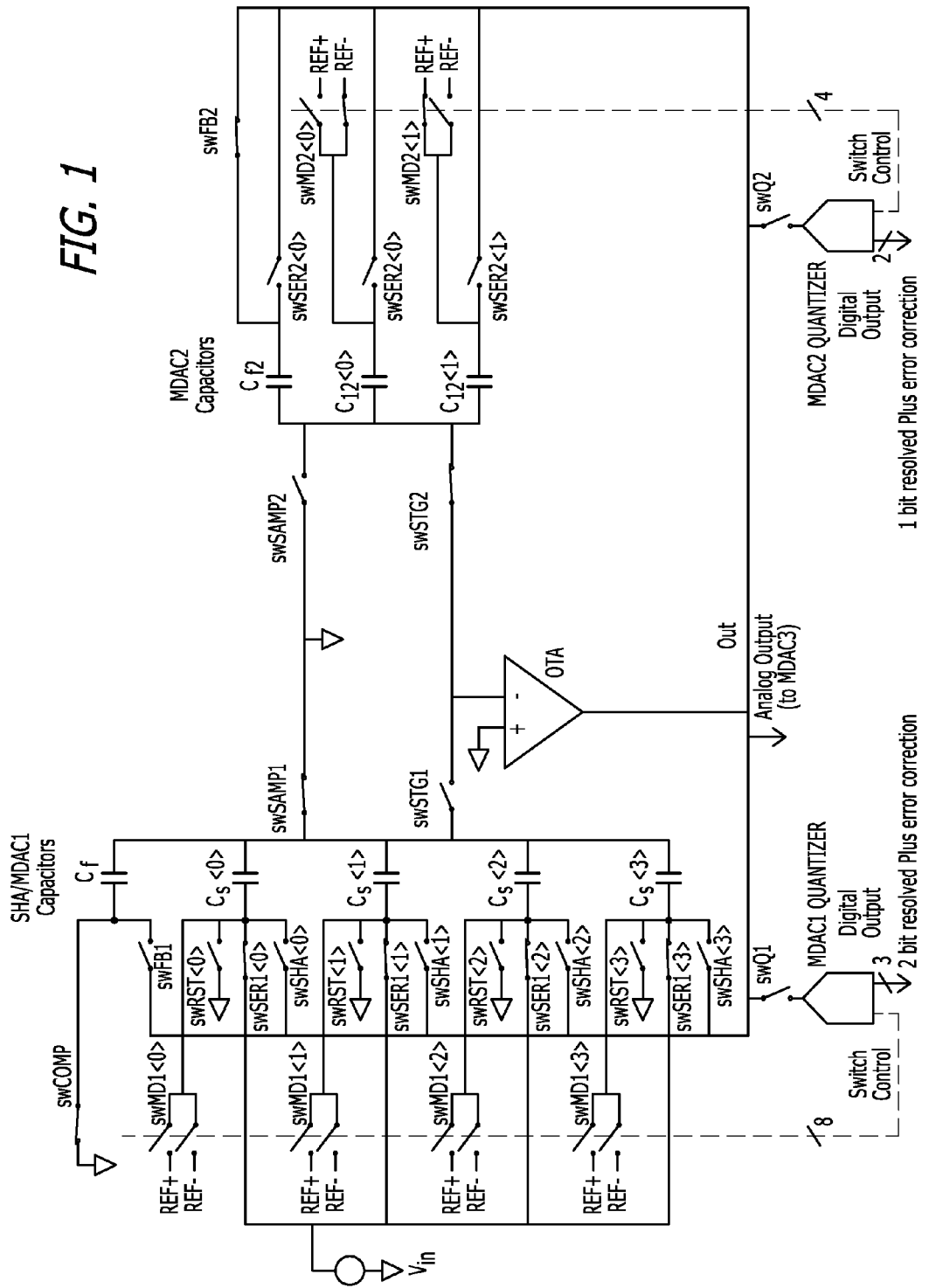
FIG. 1 is a simplified circuit schematic of the 4-phase SHA/MDAC1/MDAC2.

A simplified circuit schematic of the 4-phase MDAC1/MDAC2 is shown in FIG. 1. In this embodiment, MDAC1 resolves 2 bits plus one bit for error correction, and MDAC2 resolves 1 bit plus one bit for error correction. For clarity in the Figures to follow, and to not unnecessarily clutter the Figures, one embodiment is shown in single ended form. However, a preferred embodiment is realized as a differential circuit, using the OTA as a differential amplifier and essentially repeating the single ended circuit in an opposite polarity sense, together with common mode setting circuitry. Also such a differential circuit will normally include common mode setting circuitry. Single versus differential circuits and common mode setting circuitry are well known in the prior art, and do not themselves form any part of this invention.

In FIG. 1, the switch configuration represents the input signal tracking phase which is also the MDAC2 amplify phase. The 4-phase timing of the switch states is shown in Table 1 below. FIG. 1 shows all switches except some reset switches, with the switch settings corresponding to phase D of Table 1.

TABLE 1

Summary of Switch State vs. Clock Phase

| | PHASE | | | |
|---|---|---|---|---|
| | A<br>SHA | B<br>MDAC1 | C<br>RESET | D<br>MDAC2 |
| swSAMP1 | OFF | OFF | ON | ON |
| swSTG1 (p/m) | ON | ON | OFF | OFF |
| swSER1 (p/m) | OFF | OFF | OFF | ON |
| swRST | OFF | OFF | ON | OFF |
| swSHA (p/m) | ON | OFF | OFF | OFF |
| swMD1 (p/m) | OFF | ON | OFF | OFF |
| swCOMP (p/m) | OFF | OFF | ON | ON |
| swFB1 (p/m) | OFF | ON | OFF | OFF |
| swSAMP2 | ON | ON | OFF | OFF |
| swSTG2 (p/m) | OFF | OFF | ON | ON |
| swSER2 (p/m) | OFF | ON | OFF | OFF |
| swMD2 (p/m) | OFF | OFF | ON | ON |
| swFB2 (p/m) | OFF | ON | ON | ON |
| swQ1 | ON | OFF | OFF | OFF |
| swQ2 | OFF | ON | OFF | OFF |

Figure 2:
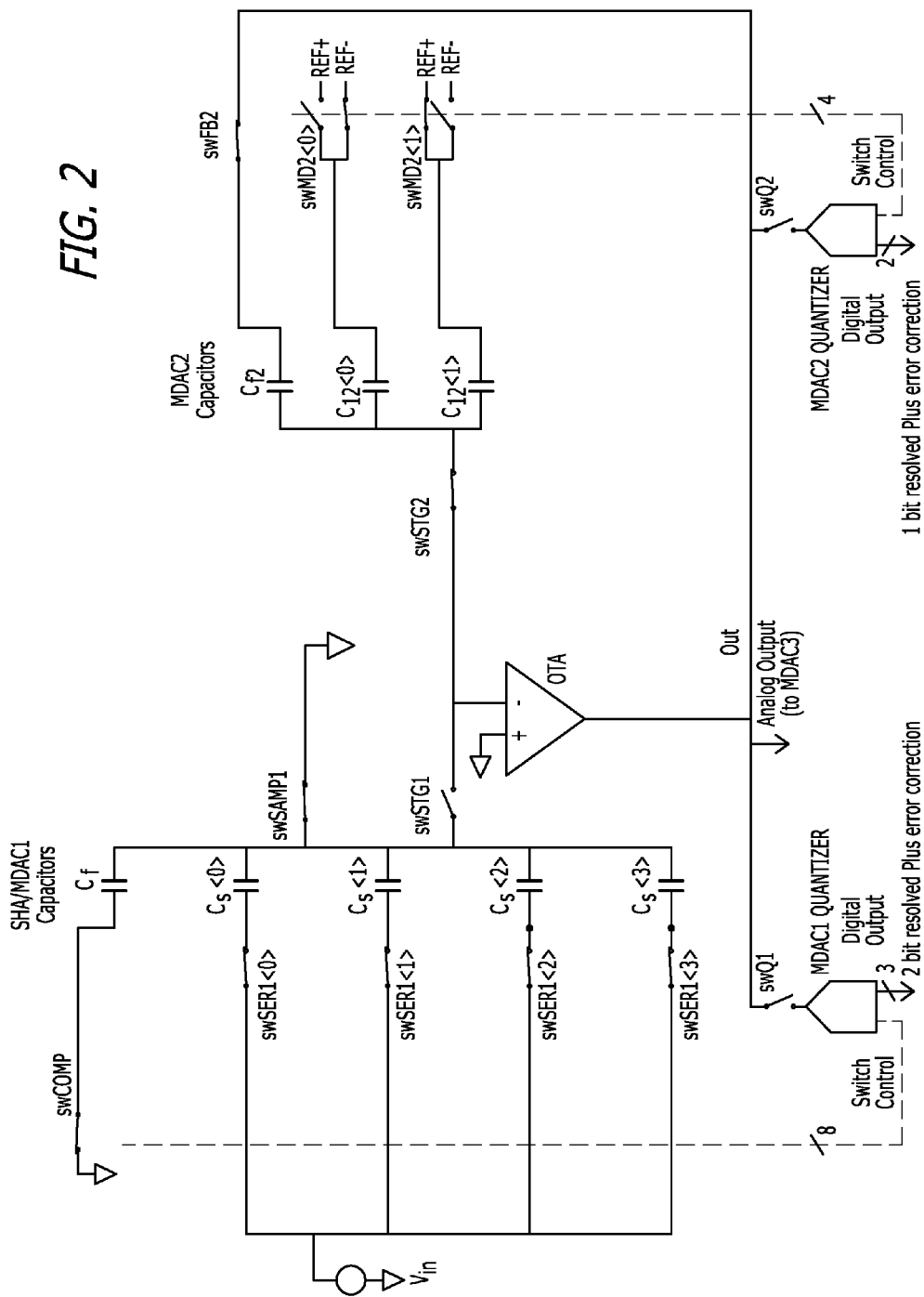
FIG. 2 illustrates the active part of the circuit for phase D defined by the closed switches in accordance with Table 1.
Figure 3:
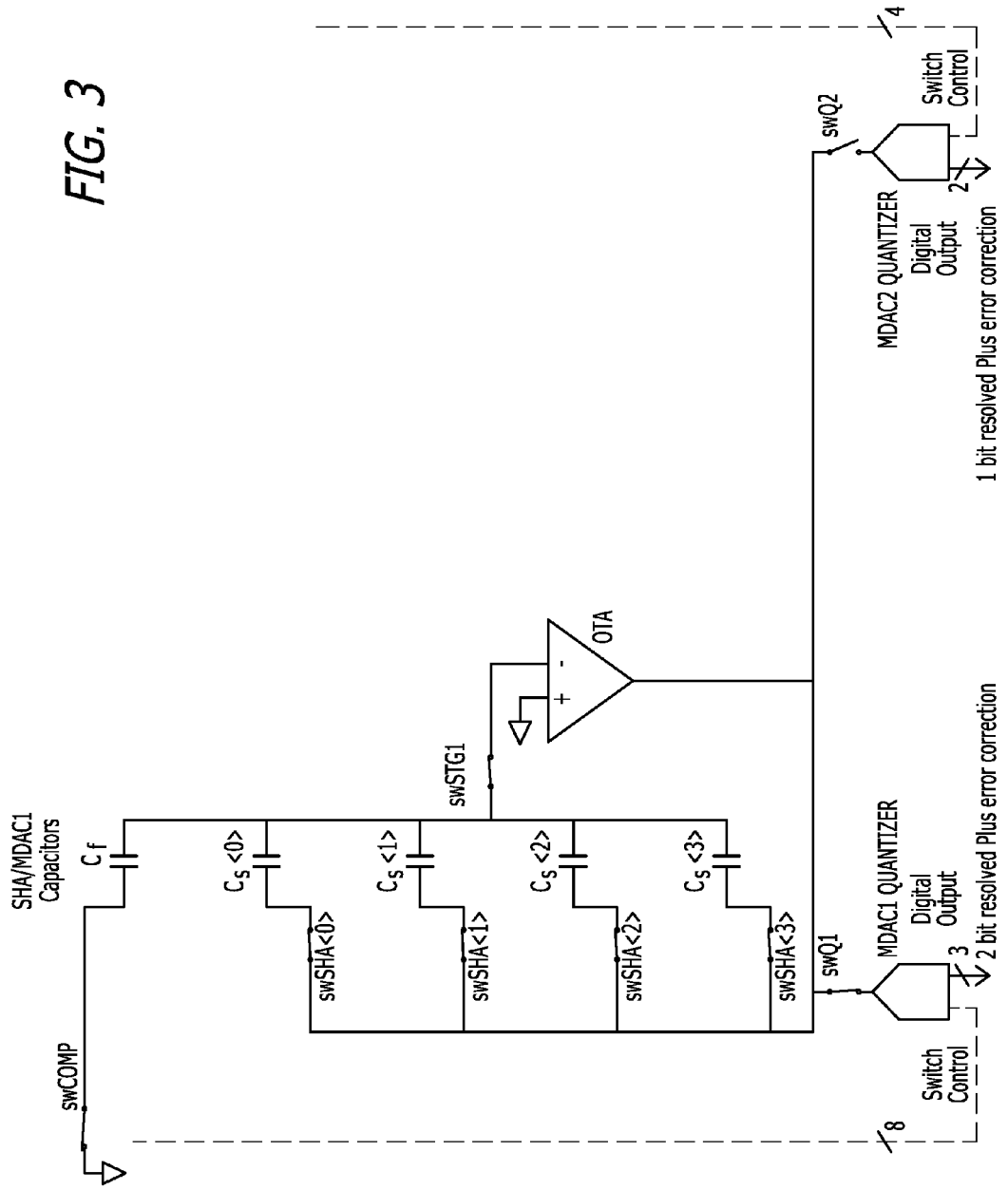
FIG. 3 illustrates only the active part of the circuit for phase A defined by the closed switches for phase A.
Figure 4:
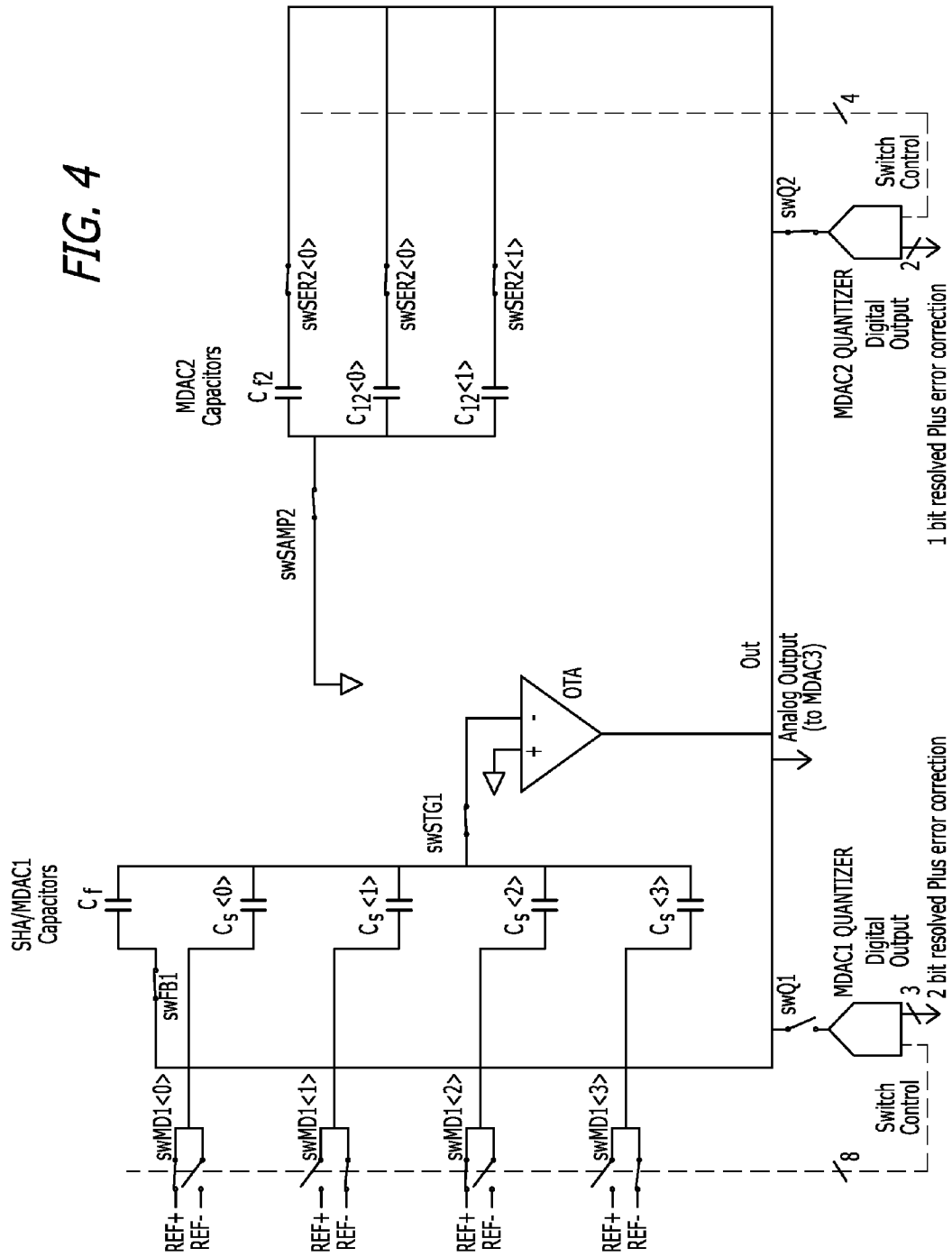
FIG. 4 illustrates only the active part of the circuit for phase B defined by the closed switches for phase B.
Figure 5:
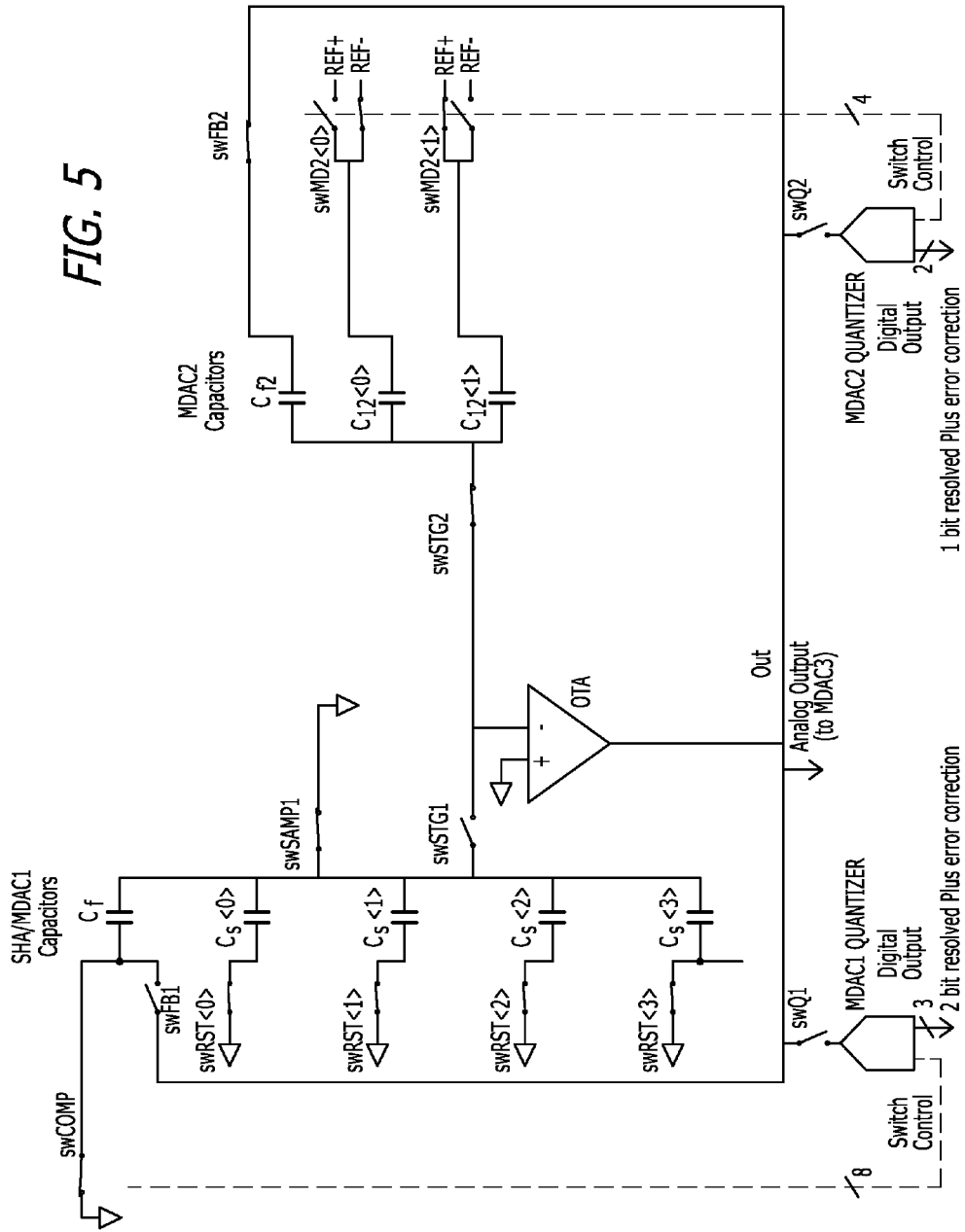
FIG. 5 illustrates only the active part of the circuit for phase C defined by the closed switches for phase C.

To follow the switch settings more easily, FIG. 2 illustrates only the active part of the circuit for phase D defined by the closed switches in accordance with Table 1, FIG. 3 illustrates only the active part of the circuit for phase A defined by the closed switches for phase A, FIG. 4 illustrates only the active part of the circuit for phase B defined by the closed switches for phase B, and FIG. 5 illustrates only the active part of the circuit for phase C defined by the closed switches for phase C. The clock phases are shown in FIG. 6.

Figure 6:
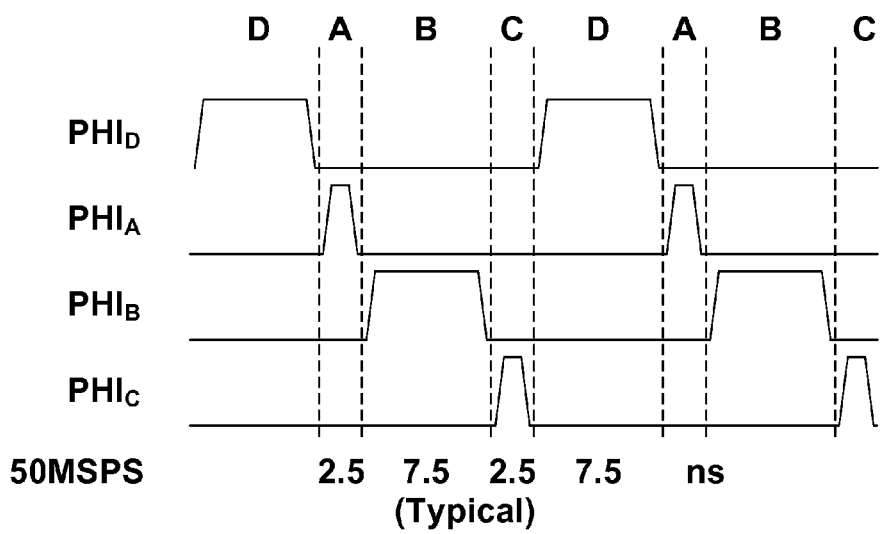
FIG. 6 illustrates the clock phases A, B, C and D.

In phase D (FIG. 2), the input signal Vin is sampled, and held on the input signal sampling capacitors $C_s$<0:3> on the falling edge of $PHI_D$ (FIG. 6). Capacitor Cf is reset (discharged), as both leads thereof are connected to the circuit ground. At this time, the two bit output of MDAC2 is controlling switches swMD2, with the residue of MDAC 2 being amplified and output to the next stage of the ADC (see FIG. 7). Immediately following the sampling event, in phase A (FIG. 3), the sampling capacitors are connected around the OTA to drive the MDAC1 quantizer as shown. In essence, the output of the OTA settles at a voltage that drives the high input impedance differential input to the OTA to zero, i.e. the output of the OTA settles to the negative of the voltage on the input signal sampling capacitors $C_s$<0:3>. In this condition, the differential input to the OTA is zero (assuming infinite gain), so that the negative input to the OTA is also effectively at the circuit ground voltage, so that capacitor Cf remains uncharged, and capacitors $C_s<0:3>$ remain charged at the voltage of the sampled input Vin. Consequently there is no net charge transfer, as all capacitors remain with the charge thereon from phase D. Since there is no charge transfer, there is no noise added in this SHA phase. The SHA phase can be relatively short (approximately T/8) because it settles quickly and need not settle to a high degree of precision.

At the end of Phase A, the MDAC1 quantizer latches and capacitors $C_s<0:3>$ are connected to the references based on the quantizer decision, and capacitor $C_f$ is connected around the OTA (phase B, FIG. 4). This is the MDAC1 amplify phase, wherein the output of the OTA causes capacitor Cf to drive the net voltage on the negative input to the OTA to a virtual circuit ground, providing the residue voltage as the output of the OTA. It is also the MDAC2 decision phase, the OTA having charged capacitors $C_{f2}$ and capacitors $C_{12}<0:1>$ with the residue of the first stage (MDAC1). Approximately 3T/8 is available for MDAC1 output settling during this time. This corresponds to a 33% higher sample rate compared to a full T/2 settling period. The capacitors $C_{12}<0:1>$ are referred to as MDAC2 input capacitors to distinguish them from the input sampling capacitors $C_s<0:3>$.

Figure 7:
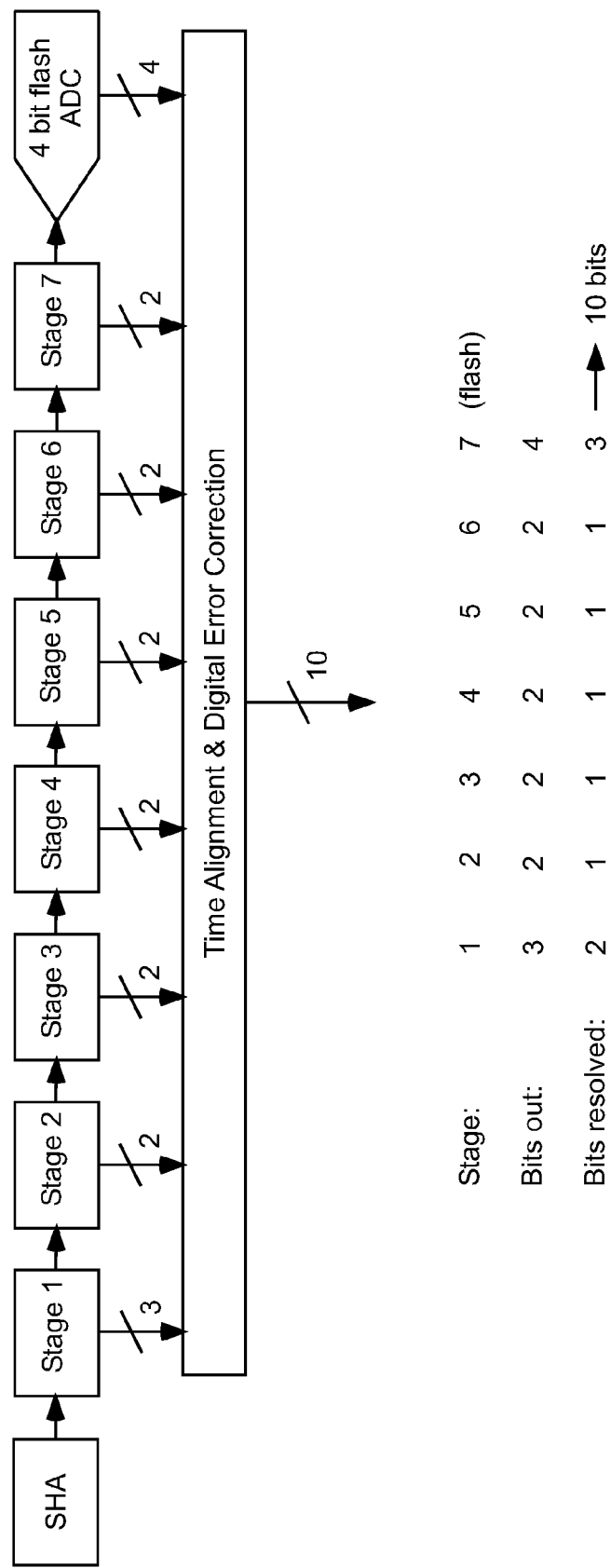
FIG. 7 illustrates the typical configuration of a multistage pipelined ADC, including an input sample/hold amplifier.
Figure 8:
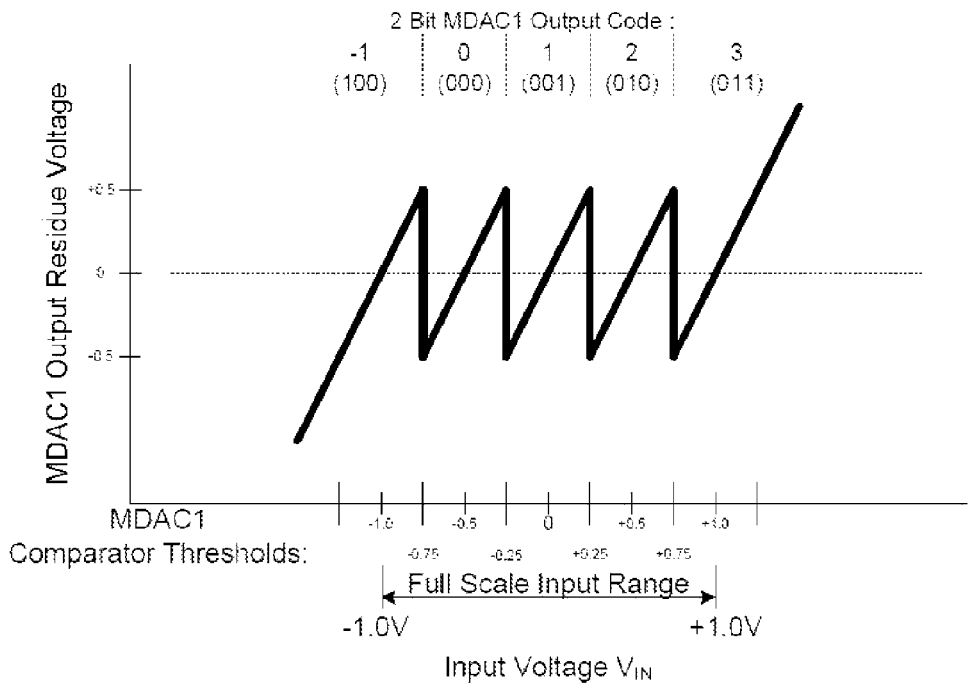
FIG. 8 presents the MDAC1 transfer function for an exemplary embodiment of the present invention.

On the falling edge of $PHI_B$ (FIG. 6, beginning of Phase FIG. 5), MDAC2 quantizer latches based on the MDAC1 residue output, and the MDAC1 capacitors Cs<0:3> are reset during phase C (approximately T/8). Resetting of these capacitors is optional, as they will be charged to the input signal Vin during phase D anyway, but is preferred. Capacitors $C_s<0:3>$ are connected to the references based on the MDAC2 quantizer decision. The output of the OTA is the residue of MDAC2, which is coupled to the next stage or to a flash ADC and the system is returned to input signal tracking during phase D, hereinbefore described. FIG. 7 illustrates an exemplary 10 bit ADC with error correction using the present invention. The number of bits resolved in each stage is a matter of choice.

TABLE 2

| Input Voltage | MDAC1 Code | Cs MDAC1 Caps | MDAC1 Residue Voltage | Subsequent 12-Bit Output Code Range |
|---|---|---|---|---|
| $V_{IN} < -0.75$ | 100 | 0 to $V_{REF}^+$ 4 to $V_{REF}^-$ | $2 * (V_{IN} + 1.0)$ | 0-511 |
| $-0.75 < V_{IN} < -0.25$ | 000 | 1 to $V_{REF}^+$ 3 to $V_{REF}^-$ | $2 * (V_{IN} + 0.5)$ | 512-1535 |
| $-0.25 < V_{IN} < 0.25$ | 001 | 2 to $V_{REF}^+$ 2 to $V_{REF}^-$ | $2 * (V_{IN})$ | 1536-2559 |
| $+0.25 < V_{IN} < +0.75$ | 010 | 3 to $V_{REF}^+$ 1 to $V_{REF}^-$ | $2 * (V_{IN} - 0.5)$ | 2560-3583 |
| $+0.75 < V_{IN}$ | 011 | 4 to $V_{REF}^+$ 0 to $V_{REF}^-$ | $2 * (V_{IN} - 1.0)$ | 3584-4095 |

$V_{REF}^+ = +0.5$ V
$V_{REF}^- = -0.5$ V
Note:
MDAC code is 3 bits because there are 5 subranges. Only half of each outer subrange is used within the Full scale range of the ADC.

Figure 9:
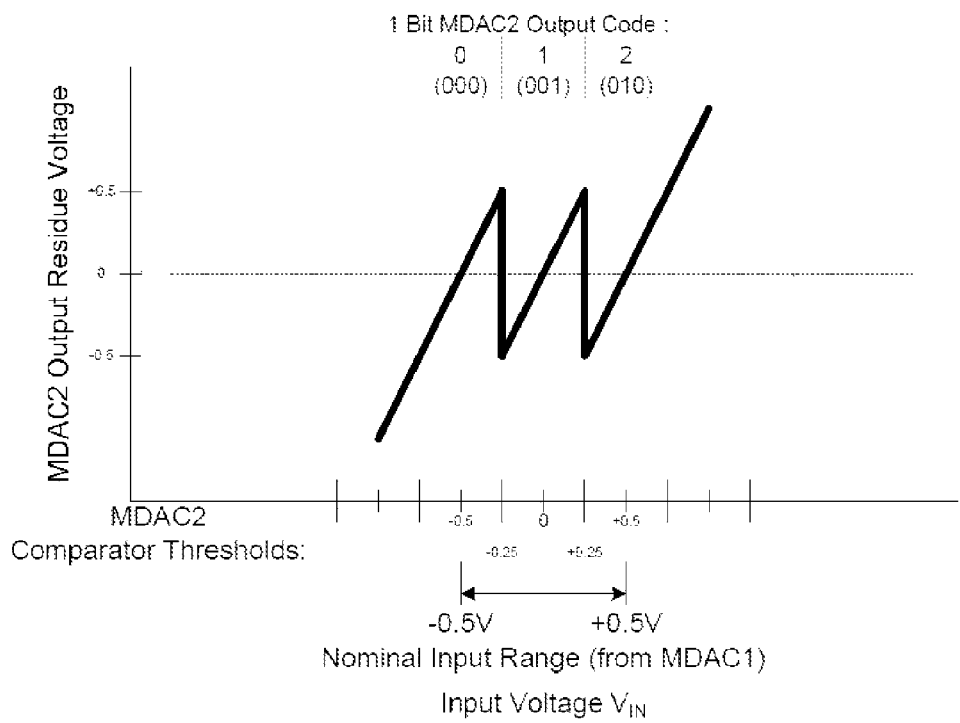
FIG. 9 presents the MDAC2 transfer function for an exemplary embodiment of the present invention.

FIG. 9 presents the MDAC2 transfer function for an exemplary embodiment, with the following Table 3 presenting the MDAC1 code and voltage ranges.

TABLE 3

| Input Voltage | MDAC2 Code | $C_{12}$ MDAC2 Caps | MDAC2 Residue Voltage |
|---|---|---|---|
| $V_{IN} < -0.25$ | 00 | 0 to $V_{REF}^+$ 2 to $V_{REF}^-$ | $2 * (V_{IN} + 0.5)$ |
| $-0.25 < V_{IN} < 0.25$ | 01 | 1 to $V_{REF}^+$ 1 to $V_{REF}^-$ | $2 * (V_{IN})$ |
| $+0.25 < V_{IN}$ | 10 | 2 to $V_{REF}^+$ 0 to $V_{REF}^-$ | $2 * (V_{IN} - 0.5)$ |

$V_{REF}^+ = +0.5$ V
$V_{REF}^- = -0.5$ V
Note:
MDAC code is 2 bits because there are 3 subranges. Only half of each outer subrange is used within the nominal input range (output of MDAC). This provides over-range coverage to correct for offsets and other, nonidealities in the analog circuits.

Figure 10A:
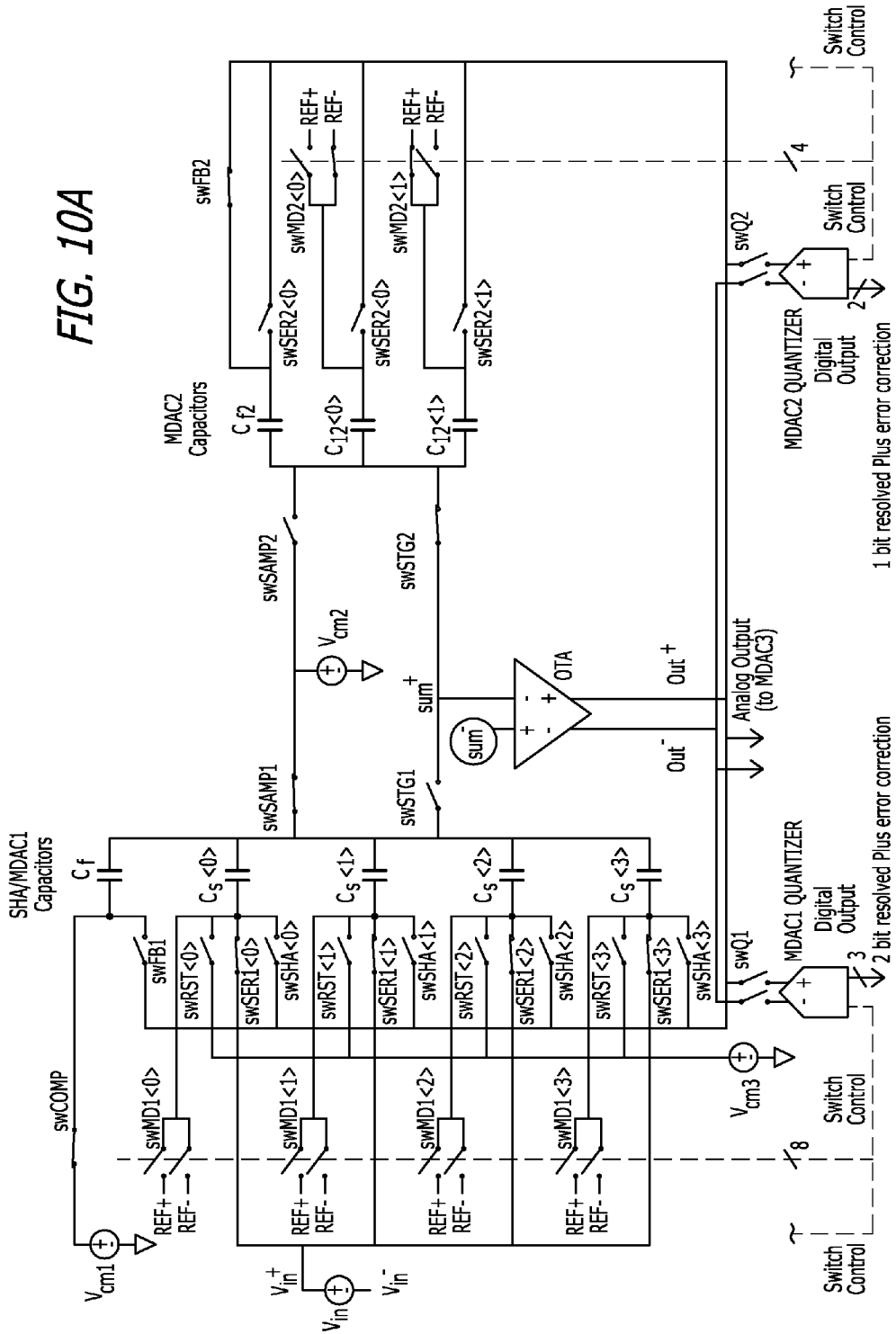
FIGS. 10A and 10B illustrate a differential embodiment of the present invention.
Figure 10B:
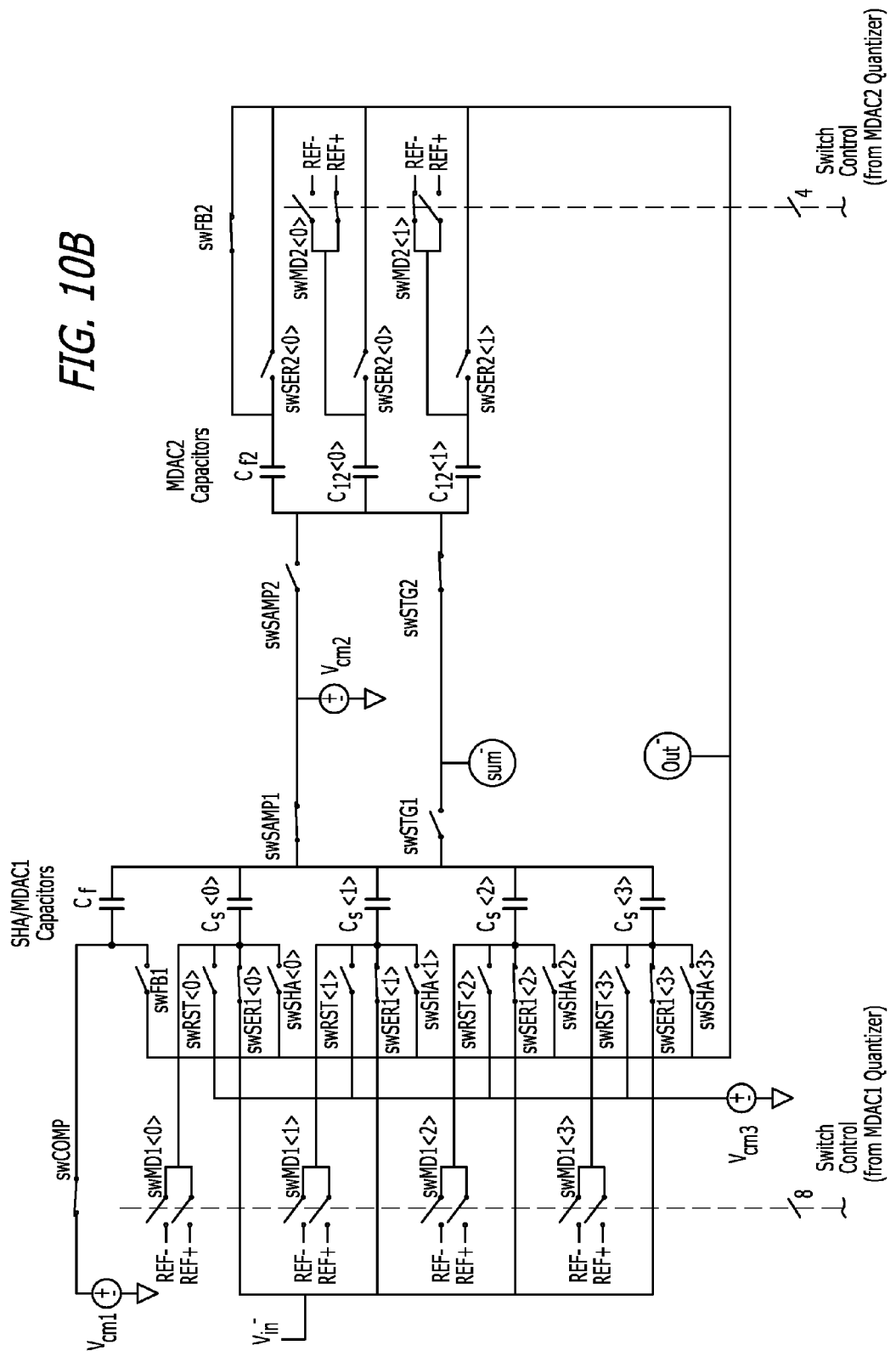

Now referring to FIGS. 10A and 10B, a differential embodiment of the present invention may be seen. FIG. 10A is a repeat of the general Figure of FIG. 1, but showing, the positive side $V_{IN}^+$ of the differential input $V_{IN}$ ($V_{IN}^+$ and $V_{IN}^-$), the OTA as a differential input, differential output amplifier, the quantizers as differential input quantizers, and also showing common mode voltage sources $V_{CM1}$, $V_{CM2}$ and $V_{CM3}$. These common mode voltages could be the same common mode voltage, though using three different common mode voltages is preferred, as some performance improvement can be obtained by doing so. Aside from the differential circuits, FIG. 10A primarily illustrates the processing, so to speak, of the positive side of the differential embodiment. FIG. 10B receives the negative side of the differential input $V_{IN}^-$ of the differential input $V_{IN}^+$ and $V_{IN}^-$. FIG. 10B is connected to the circuit of FIG. 10A to receive the signal Out and provide the signal SUM$^-$, and to receive the quantizer switch control outputs and common switch controls. This Figure also is essentially a repeat of FIG. 1 for the negative side of the differential input. However note that the reference voltage REF+ and REF− are reversed in polarity in comparison to FIG. 10A. In FIG. 10B, the various switches and capacitors have the same labels as in FIG. 10A, as adding a further identification label would unnecessarily clutter the Figures, though course in FIG. 10B, they are simply a replication of those in FIG. 10A, and have the same function and switching sequence as those of FIGS. 1 and 10A.

Figure 11A:
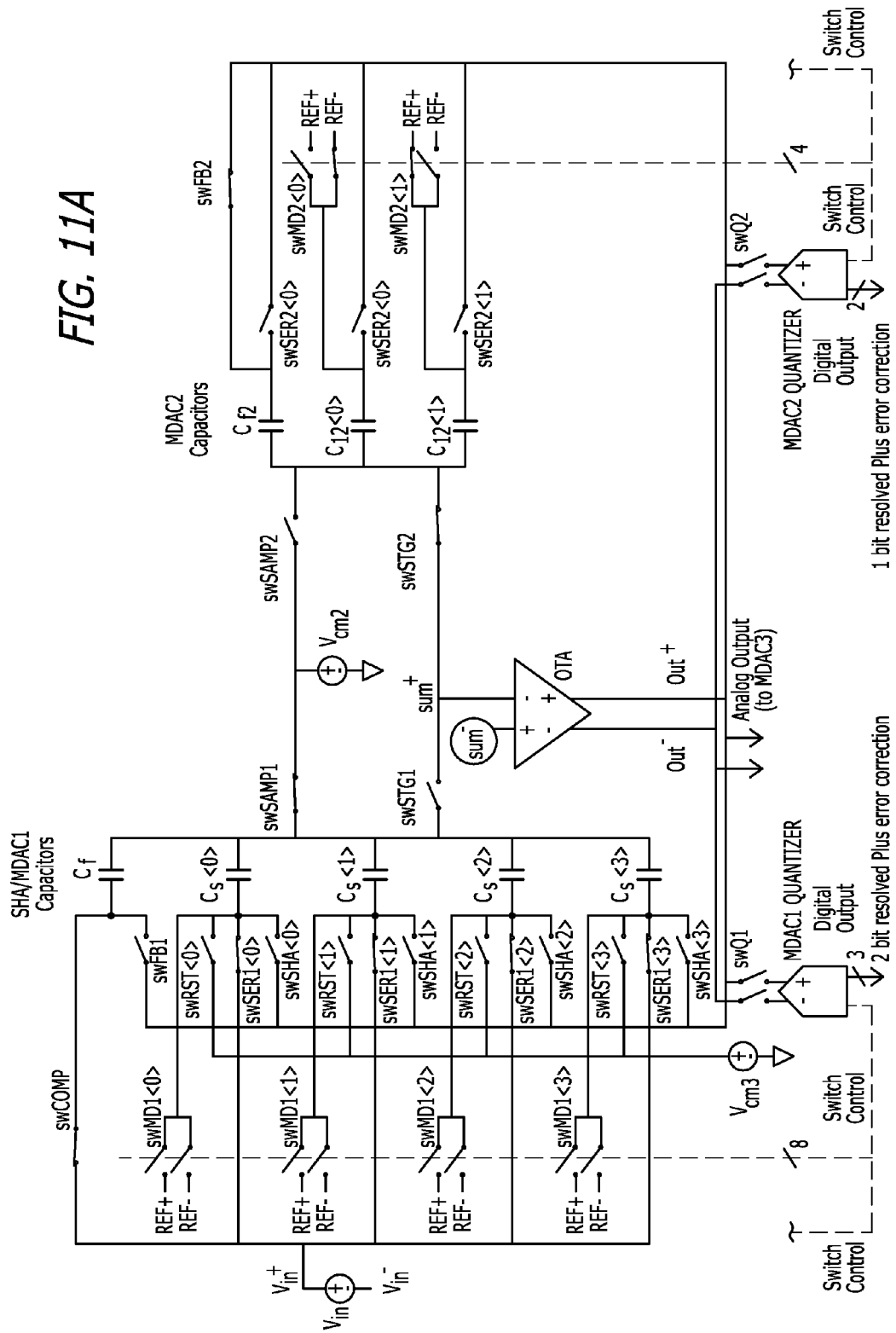
FIGS. 11A and 11B illustrate an alternate differential embodiment of the present invention.
Figure 11B:
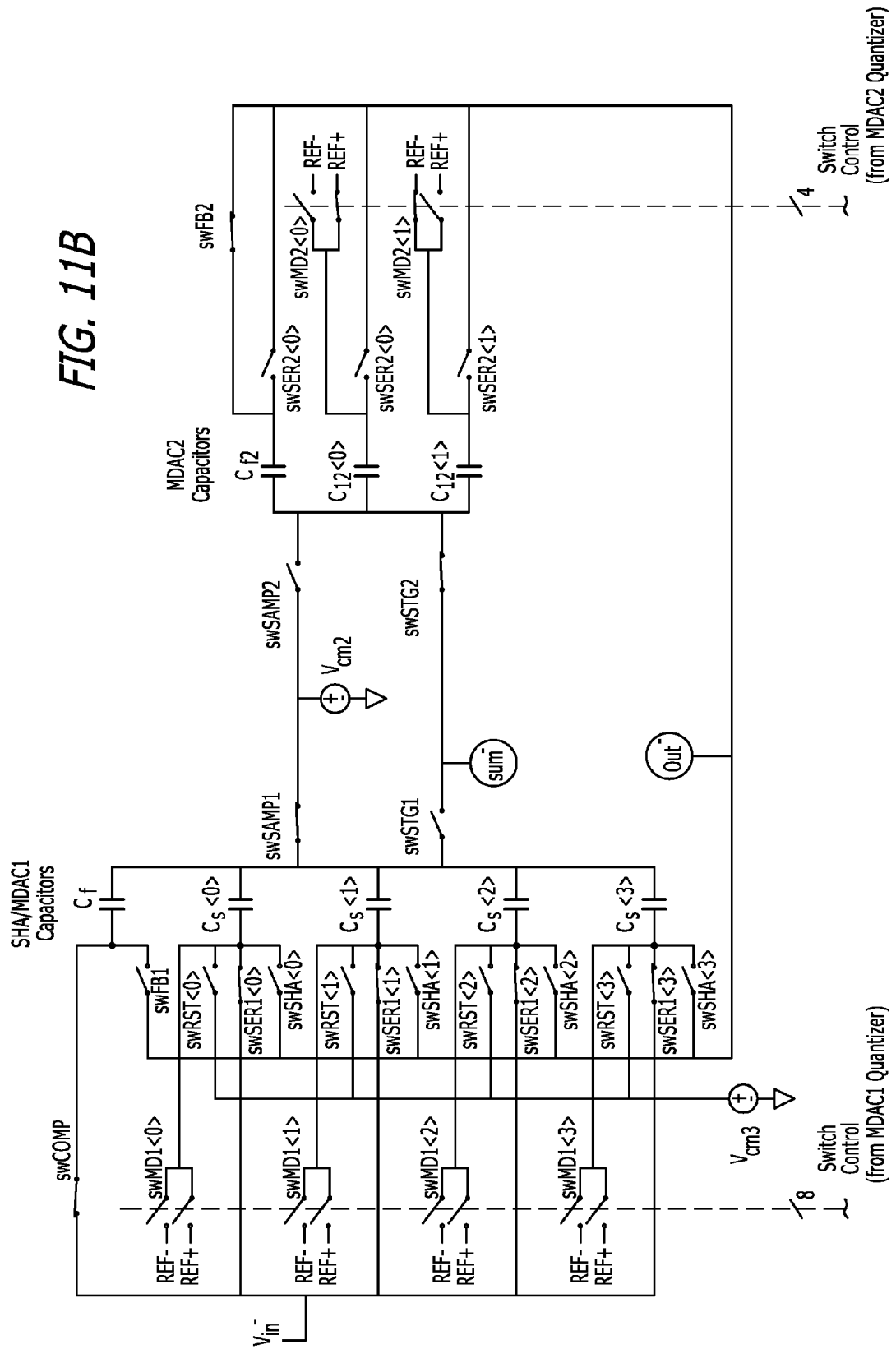

FIGS. 11A and 11B illustrate an alternate differential embodiment. In these Figures, one side of the switches swCOMP are coupled to the input signal sampling capacitors $C_s<0:3>$ instead of a common mode voltage. This affects the required size of the capacitor, but otherwise does not affect the circuit operation. Also in FIGS. 10A and 10B, as well as FIGS. 11A and 11B, the input signal sampling capacitors are reset to the circuit ground. Alternatively, and more preferably, these capacitors as well as the feedback capacitors $C_f$ would be reset to a common mode voltage, or reset by coupling the capacitors of FIG. 10A (11A) to those of FIG. 10B (11B), though resetting is optional, and itself is well known.

The present invention solves the problem of additional noise and power dissipation associated with an input SHA in a pipelined ADC. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. In a pipelined ADC having first and second ADC input connections for together receiving a differential input signal, a method comprising:

a) providing an operational transconductance amplifier (OTA) having a differential input and a differential output, and a first quantizer connection;
b) for each ADC input connection;
   1) providing a plurality of input signal sampling capacitors, a first feedback capacitor, a second lead of the feedback capacitor being coupled to second leads of the input signal sampling capacitors;
   2) coupling a first lead of the feedback capacitor to a first voltage, coupling the second leads of the input signal sampling capacitors to a second common mode voltage, and coupling first leads of the input signal sampling capacitors to a respective one of the ADC input connections;
   3) decoupling the first leads of the input signal sampling capacitors from the respective one of the ADC input connections and decoupling the second leads of the input signal sampling capacitors from the second common mode voltage;
   4) coupling the second leads of the input signal sampling capacitors to a respective one of the differential inputs of the OTA and coupling a respective output of the OTA to the first leads of the input signal sampling capacitors and to an input to a first quantizer;
c) latching an output of the first quantizer; and,
d) for each ADC input connection;
   1) coupling the first lead of the first feedback capacitor to the output of the OTA, and coupling the first lead of each of the input signal sampling capacitors to a positive or a negative voltage responsive to the output latched in the first quantizer.

2. The method of claim 1 wherein the first voltage is a first common mode voltage.

3. The method of claim 1 wherein the first voltage is the voltage on the first leads of the respective input signal sampling capacitors.

4. The method of claim 1 further comprising:
e) providing a second quantizer having a differential input, and coupling the differential output of the OTA to an input to the second quantizer;
f) for each ADC input connection;
   1) providing a plurality of second quantizer input capacitors and a second feedback capacitor, a second lead of the second feedback capacitor being coupled to second leads of the second quantizer input capacitors;
   2) coupling a respective output of the OTA to the first leads of the respective second quantizer input capacitors and the first lead of the respective feedback capacitor, and coupling the second leads of the second quantizer input capacitors to the second common mode voltage;

g) latching the output of the second quantizer;
h) for each ADC input connection;
   1) coupling the second leads of the respective second feedback capacitor and the respective second quantizer input capacitors to a respective input of the OTA, coupling the first lead of the respective second feedback capacitor to a respective output of the OTA, and coupling the first lead of each of the second quantizer input capacitors to a positive or a negative voltage responsive to the output latched in the second quantizer.

5. The method of claim 4 further comprising:
i) providing the output of the OTA as a residue to another stage of the pipelined ADC.

6. The method of claim 4 further comprising:
after latching an output of the first quantizer in c), decoupling the first leads of the input signal sampling capacitors from the input to the first quantizer.

7. The method of claim 4 further comprising:
after latching the output of the second quantizer in g), decoupling the first leads of the second quantizer input capacitors from the input to the second quantizer.

8. The method of claim 4 wherein the first voltage is a first common mode voltage, and the first and second common mode voltages are the same voltage.

9. The method of claim 4 wherein the first voltage is a first common mode voltage, and the first and second common mode voltage are different voltages.

10. The method of claim 4 further comprising:
resetting the input signal sampling capacitors and the first feedback capacitor during h)1).

11. The method of claim 4 further comprising:
resetting the input signal sampling capacitors and the first feedback capacitor by coupling the first leads thereof to a third common mode voltage and the second leads thereof to the second common mode voltage during h)1).

12. The method of claim 11 wherein the first voltage is a first common mode voltage, and the first, second and third common mode voltages are the same voltage.

13. The method of claim 11 wherein the first voltage is a first common mode voltage, and the first, second and third common mode voltage are different voltages.

14. The method of claim 1 wherein after d)1) the output of the OTA is provided as a residue to another stage of the pipelined ADC.

15. The method of claim 1 further comprising:
after latching an output of the first quantizer in c), decoupling the first leads of the input signal sampling capacitors from the input to the first quantizer.

* * * * *